(12) United States Patent
Sakoda et al.

(10) Patent No.: US 8,787,037 B2
(45) Date of Patent: Jul. 22, 2014

(54) ELECTRONIC DEVICE

(75) Inventors: Shimpei Sakoda, Kariya (JP); Yasuhiro Koike, Kariya (JP); Hiroaki Asano, Kariya (JP); Kiminori Ozaki, Kariya (JP); Sergey Moiseev, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 180 days.

(21) Appl. No.: 13/332,684

(22) Filed: Dec. 21, 2011

(65) Prior Publication Data

US 2012/0161900 A1 Jun. 28, 2012

(30) Foreign Application Priority Data

Dec. 24, 2010 (JP) .................. 2010-287469

(51) Int. Cl.
*H05K 9/00* (2006.01)
(52) U.S. Cl.
USPC .......... 361/818; 361/816; 361/817; 361/756; 361/752; 333/167; 174/50.51; 174/50.63; 174/50
(58) Field of Classification Search
USPC .......... 361/816, 817, 818, 756, 752; 363/146; 333/167; 174/50, 50.51, 50.53
See application file for complete search history.

(56) References Cited

U.S. PATENT DOCUMENTS

| | | | |
|---|---|---|---|
| 4,599,680 A * | 7/1986 | Gibson et al. ............. | 361/679.31 |
| 6,011,700 A * | 1/2000 | Matsuzaki ................. | 361/816 |
| 6,211,457 B1 * | 4/2001 | Cama et al. ............... | 174/380 |
| 6,274,810 B1 * | 8/2001 | Tsai .......................... | 174/50 |
| 6,445,568 B1 * | 9/2002 | Baur et al. ................. | 361/600 |
| 6,593,673 B1 * | 7/2003 | Sugai et al. ................ | 307/116 |
| 6,841,730 B2 * | 1/2005 | Medeiros et al. ........... | 174/50 |
| 6,849,800 B2 * | 2/2005 | Mazurkiewicz ............ | 174/394 |
| 6,870,094 B2 * | 3/2005 | Otaki ......................... | 174/382 |
| 6,940,731 B2 * | 9/2005 | Davis et al. ................ | 361/801 |
| 7,061,775 B2 * | 6/2006 | Beihoff et al. ............. | 361/818 |
| 7,433,203 B1 * | 10/2008 | Yi et al. ..................... | 361/800 |
| 7,515,431 B1 * | 4/2009 | Zadesky et al. ............ | 361/752 |
| 7,626,832 B2 * | 12/2009 | Muramatsu et al. ........ | 361/818 |
| 7,969,748 B2 * | 6/2011 | Niederkorn et al. ........ | 361/816 |
| 7,978,489 B1 * | 7/2011 | Telefus et al. .............. | 363/146 |
| 8,149,594 B2 * | 4/2012 | Nishihata ................... | 361/818 |
| 8,508,956 B2 * | 8/2013 | Nicol et al. ................. | 361/818 |
| 2001/0048593 A1 * | 12/2001 | Yamauchi et al. .......... | 361/807 |
| 2003/0039109 A1 * | 2/2003 | Kitamura et al. ........... | 361/817 |
| 2004/0141253 A1 * | 7/2004 | Funawatari et al. ........ | 360/97.01 |
| 2005/0211458 A1 * | 9/2005 | Sakamoto ................... | 174/50 |
| 2006/0250782 A1 * | 11/2006 | Lim et al. ................... | 361/816 |
| 2006/0275996 A1 * | 12/2006 | Frank ......................... | 438/396 |
| 2008/0049479 A1 * | 2/2008 | Dayan et al. ............... | 363/146 |

(Continued)

FOREIGN PATENT DOCUMENTS

| | | |
|---|---|---|
| CN | 2541896 | 3/2003 |
| JP | 11-298184 | 10/1999 |

(Continued)

*Primary Examiner* — David M Sinclair
*Assistant Examiner* — Robert Brown
(74) *Attorney, Agent, or Firm* — Baker & Hostetler LLP (57) ABSTRACT

An electronic device includes a shielding member, an electric circuit, and a filter capacitor. The electric circuit has an output line and is arranged inside the shielding member. The filter capacitor is arranged outside the shielding member to be connected to the output line.

5 Claims, 6 Drawing Sheets

(56) References Cited

U.S. PATENT DOCUMENTS

| | | | |
|---|---|---|---|
| 2008/0137306 A1* | 6/2008 | Kim | 361/709 |
| 2009/0257207 A1* | 10/2009 | Wang et al. | 361/752 |
| 2010/0151707 A1* | 6/2010 | AbuGhazaleh et al. | 439/76.1 |
| 2010/0284163 A1* | 11/2010 | Chan et al. | 361/818 |
| 2011/0051471 A1* | 3/2011 | Chen et al. | 363/21.16 |
| 2011/0079413 A1* | 4/2011 | Masumoto | 174/50 |
| 2011/0090648 A1* | 4/2011 | Chen et al. | 361/707 |
| 2011/0253411 A1* | 10/2011 | Hum et al. | 174/50 |
| 2012/0236248 A1* | 9/2012 | Kang et al. | 349/200 |

FOREIGN PATENT DOCUMENTS

| | | |
|---|---|---|
| JP | 2001-077650 A | 3/2001 |
| JP | 2009-231546 | 10/2009 |
| JP | 2009-240037 | 10/2009 |
| KR | 20020080211 A1 | 10/2002 |

* cited by examiner

ELECTRONIC DEVICE

CROSS REFERENCE TO RELATED APPLICATION

This application claims priority to Japanese Patent Application No. 2010-287469 filed Dec. 24, 2010.

FIELD OF THE INVENTION

This disclosure relates to an electronic device.

BACKGROUND

To reduce noise in electronic devices, filter capacitors have been provided on the output lines of electric circuits of electronic devices. A filter capacitor is provided inside a case that accommodates an electric circuit. For example, refer to Japanese Laid-Open Patent Publication No. 2001-77650.

However, even if a filter capacitor is provided in a case, the outside of the case is influenced to some extent by noise radiated inside the case. Specifically, if such noise is transmitted to a part of the output line of an electric circuit that is located between the filter capacitor and the case, the noise exits the case via the output line.

It is an objective of this disclosure to prevent noise generated inside a shielding member from being transmitted via an output line to an external device connected to the output line.

SUMMARY

According to this configuration, even if noise generated in the electric circuit is transmitted to the output line inside the shielding member, the noise is removed by the filter capacitor arranged outside the shielding member. The noise is therefore prevented from being emitted further outside. That is, noise generated inside the shielding member is prevented from being transmitted via the output line to the external device connected to the output line.

To achieve the foregoing objective and in accordance with one aspect of the present invention, an electronic device is provided that includes a shielding member, an electric circuit that has an output line and is arranged inside the shielding member, and a filter capacitor that is arranged outside the shielding member to be connected to the output line.

In accordance with another aspect of the present invention, a power-supply unit is provided that includes a case, which serves as a shielding member, a DC/DC converter that has an output line and is arranged inside the case, an output terminal base arranged outside the case, and a filter capacitor that is arranged outside the output terminal base to be connected to the output line.

According to this configuration, the distance between the output terminal and the filter capacitor is shortened.

According to this configuration, the filter capacitor shielding member shields the perimeter of the filter capacitor. This reduces the influence of external noise on the filter capacitor.

DETAILED DESCRIPTION OF ILLUSTRATIVE EMBODIMENTS

FIGS. 1 to 4 show one embodiment of the present disclosure.

Figure 1:
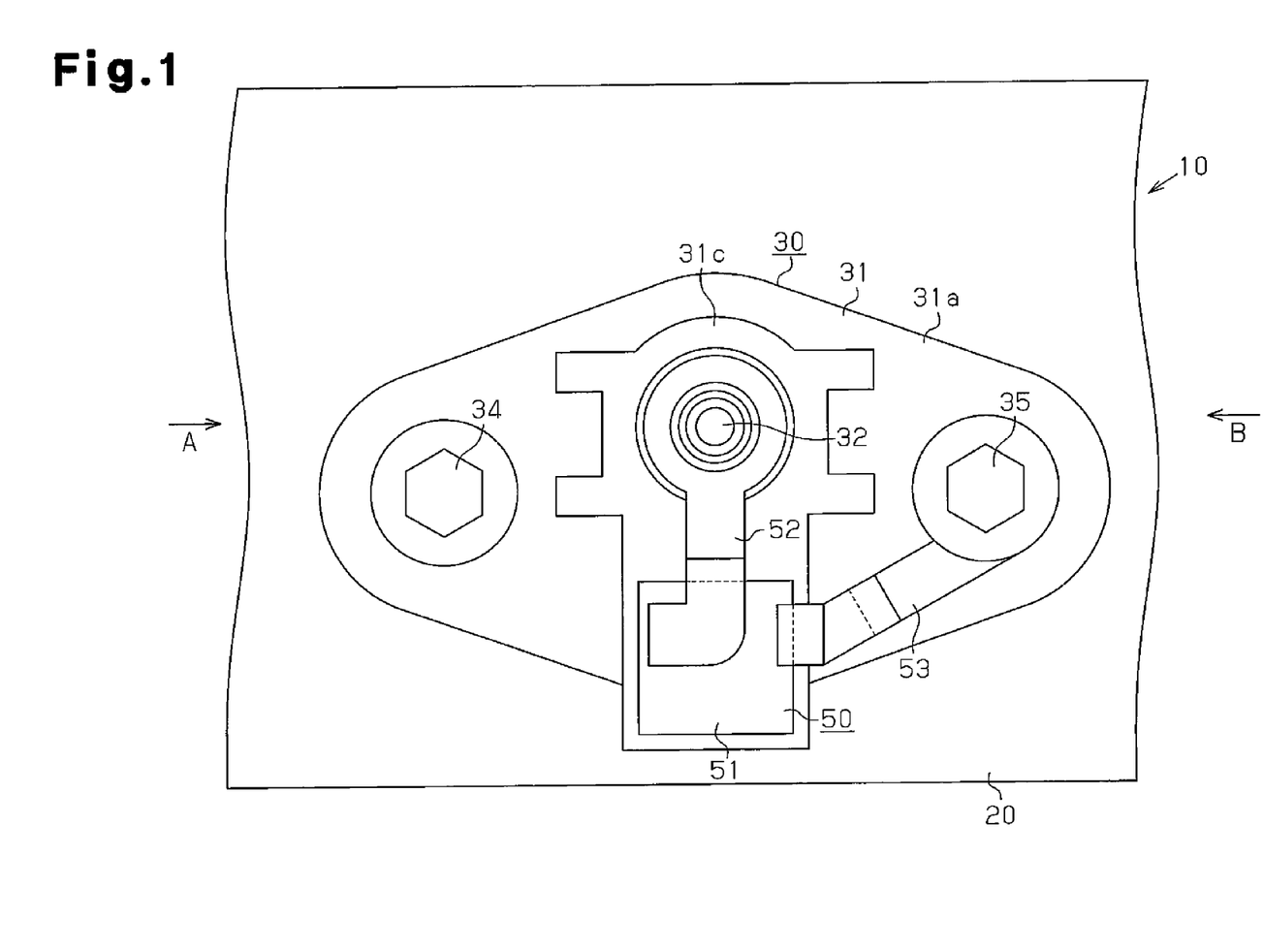
FIG. 1 is a front view showing a power-supply unit according to one embodiment.
Figure 2:
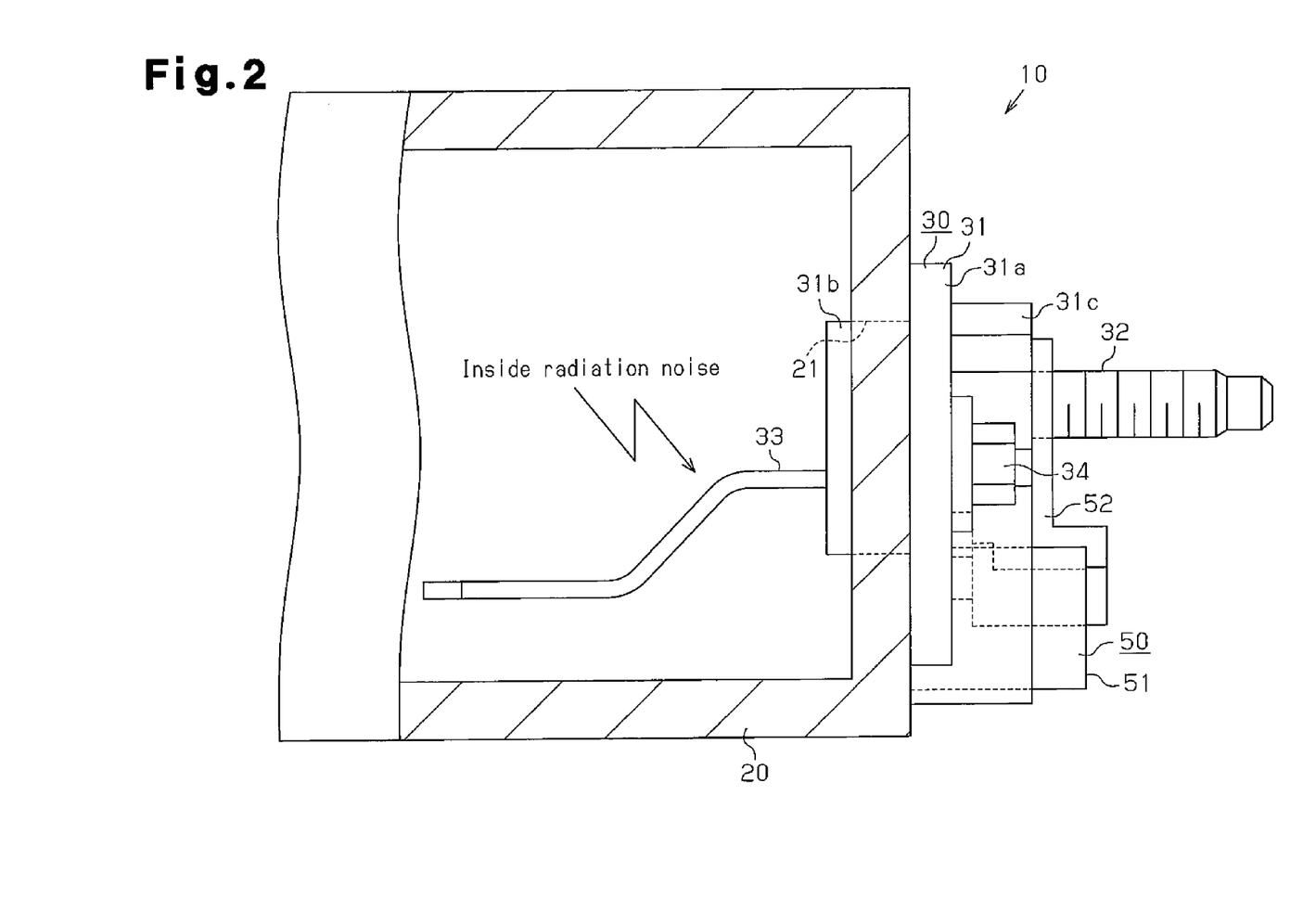
FIG. 2 is a left-side view of the power-supply unit of FIG. 1, or a side view, with a part cut away, illustrating the power-supply unit as viewed in the direction of arrow A in FIG. 1.
Figure 3:
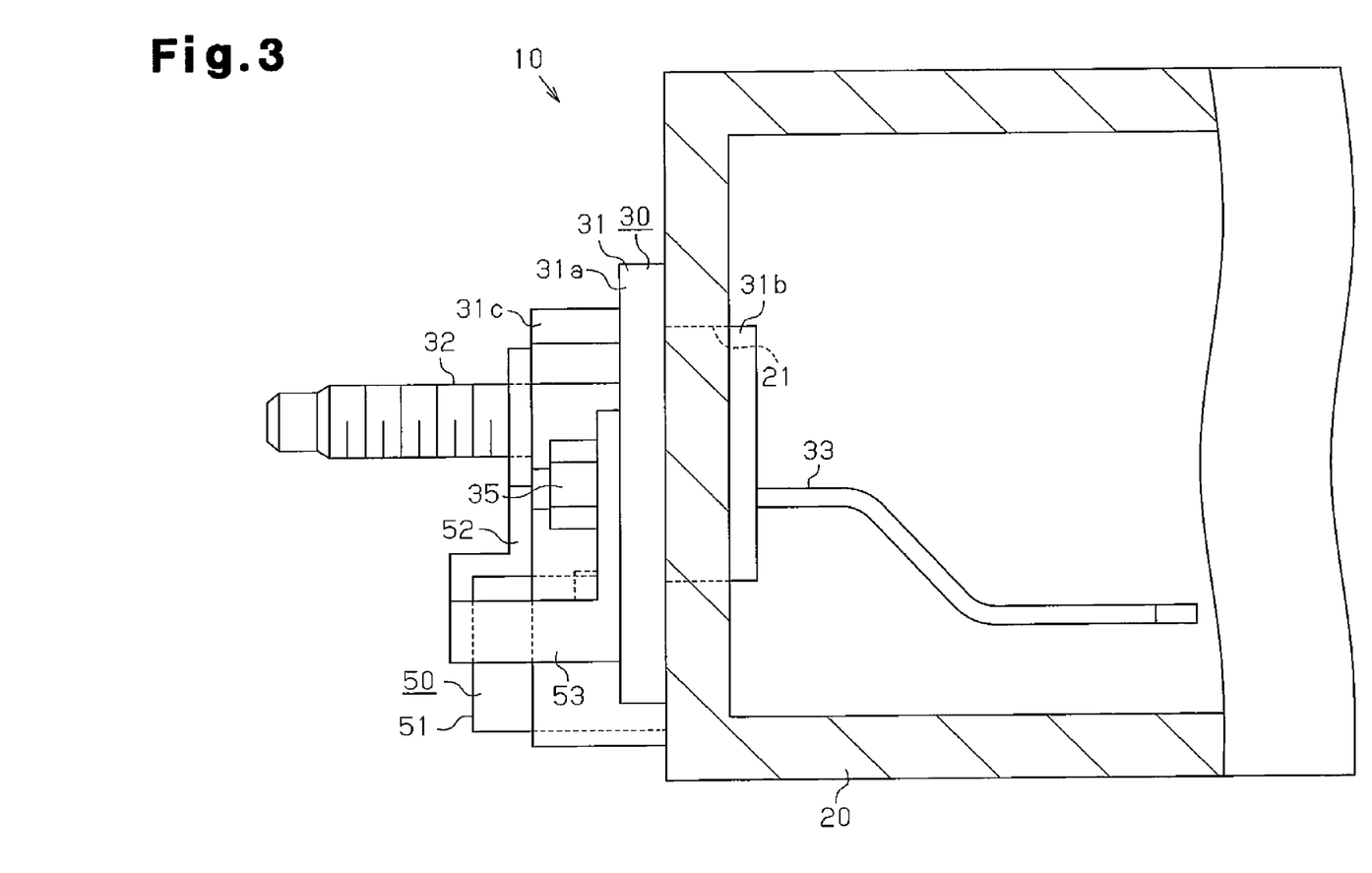
FIG. 3 is a right-side view of the power-supply unit of FIG. 1, or a side view, with a part cut away, illustrating the power-supply unit as viewed in the direction of arrow B in FIG. 1.

As shown in FIGS. 1, 2, and 3, an electronic device, which is a power-supply unit 10, has a box-like case 20. The case 20 is made of aluminum, is set to the grounding potential, and functions as a shielding member. An electric circuit, which is a DC/DC converter 40 shown in FIG. 4, is arranged inside the case 20.

Figure 4:
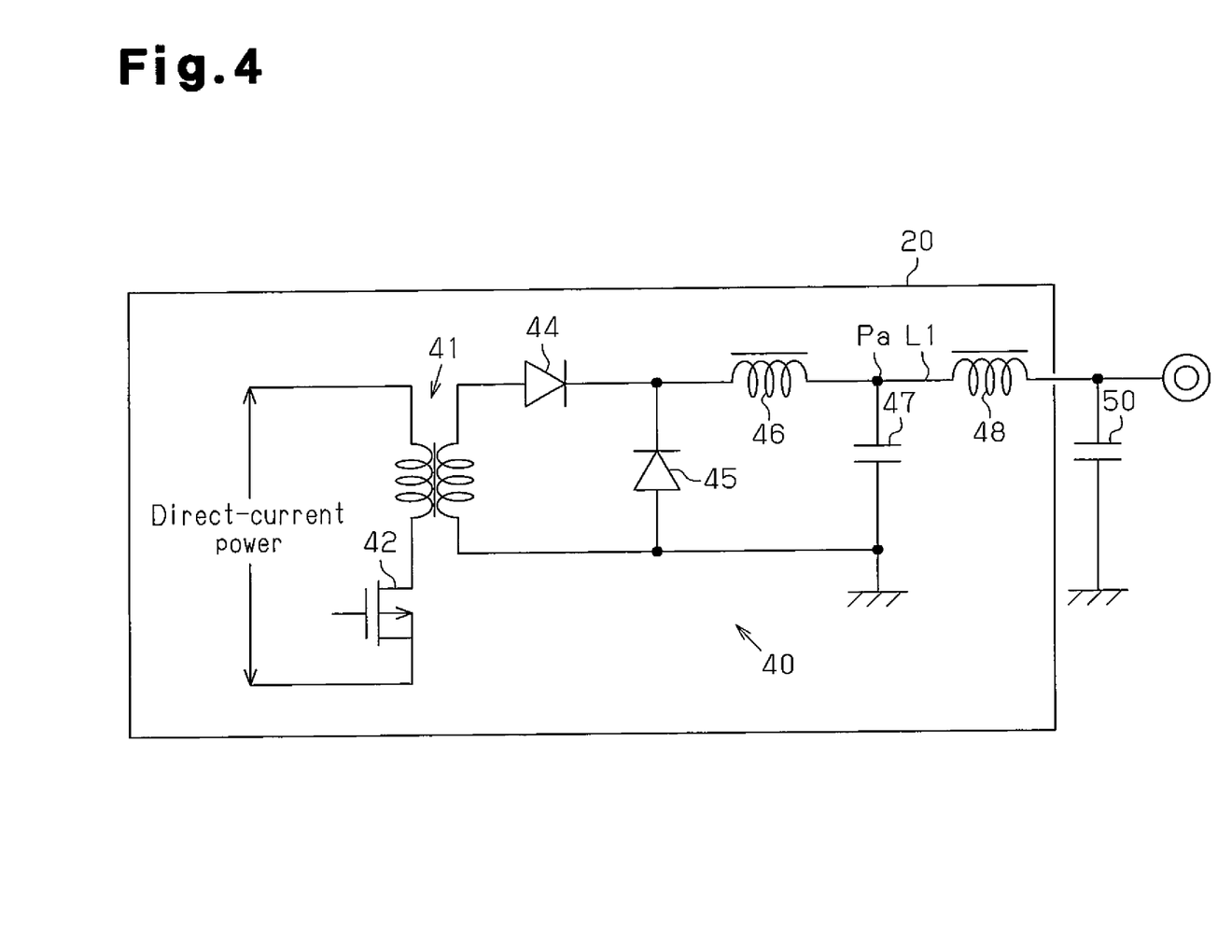
FIG. 4 is a diagram showing the electrical configuration of the power-supply unit of FIG. 1.

As shown in FIG. 4, the DC/DC converter 40 is a forward switching power-supply converter and includes a transformer 41, switching element 42, diodes 44, 45, an inductor 46, and a capacitor 47. A switching element 42 is connected to the primary side of the transformer 41, and the inductor 46 and the capacitor 47 are connected to the secondary side of the transformer 41 via the diodes 44, 45. External DC power is supplied to the primary side of the transformer 41. When the switching element 42 executes switching, converted power is output at the secondary side of the transformer 41 via the inductor 46 and the capacitor 47. An output line L1 extends from a connection point Pa between the inductor 46 and the capacitor 47. A filter inductor 48 is located on the output line L1. The output line L1 extends to the outside of the case 20 and is connected to a filter capacitor 50 located outside of the case 20. The proximal end of a terminal screw 32 is electrically connected to the proximal end of a terminal plate 33 inside a terminal base main body 31.

The transformer 41, the switching element 42, the diodes 44, 45, the inductor 46, the capacitor 47, and the filter inductor 48 are mounted on a printed circuit board (not shown). Various electronic components including the printed board are arranged inside the case 20.

As shown in FIGS. 1, 2, and 3, an output terminal base 30 is attached to an outer side surface of the case 20. The output terminal base 30 includes the terminal base main body 31, which is made of resin, the terminal screw 32, which extends from the terminal base main body 31 to the outside of the case 20, and the terminal plate 33, which extends inward in the case 20 from the terminal base main body 31. The terminal base main body 31 is fastened to the case 20 by fixing bolts 34, 35.

The terminal base main body 31 includes a terminal base plate 31a, which contacts the outer side surface of the case 20, an inward protrusion 31b, which protrudes inward in the case 20 from the terminal base plate 31a, and an outward projection 31c, which protrudes outward from the case 20 from the terminal base plate 31a. That is, the terminal base plate 31a has a contact surface that contacts the outer side surface of the case 20 and an exposed surface on the opposite side to the contact surface. The inward protrusion 31b protrudes inwardly into the case 20 from the contact surface of the terminal base plate 31a. The inward protrusion 31b is inserted in a through hole 21 formed in the case 20. The outward protrusion 31c protrudes outward of the case 20 from the exposed surface of the terminal base plate 31a.

The fixing bolts 34, 35 extend through the terminal base plate 31a and are threaded into the case 20.

The terminal plate 33, which is made of a band plate, has a proximal end embedded in the terminal base main body 31, and the distal end of the terminal plate 33 is exposed via the inward protrusion 31b of the terminal base main body 31 and extends inward in the case 20. The proximal end of the terminal screw 32 is embedded in the terminal base main body 31, and the distal end of the terminal screw 32 is exposed via the outward protrusion 31c of the terminal base main body 31 and extends outward from the case 20.

The distal end of the terminal plate 33 is electrically connected to one end of the filter inductor 48 in the case 20. That is, on the output line L1 of the DC/DC converter 40 shown in FIG. 4, the solid line extending from the filter inductor 48 to the outside of the case 20 is formed by the terminal plate 33 and the terminal screw 32. The distal end of the terminal screw 32 is connected to the external device via a harness outside the case 20. That is, a terminal to which the harness is connected is fitted to the distal end of the terminal screw 32, and the terminal screw 32 is fastened to the external device by another bolt.

In this manner, the output terminal base 30 is attached to the outer side of the case 20 to be provided on the output line L1 of the DC/DC converter 40. That is, the output line L1 of the DC/DC converter 40 is connected to the external device via the output terminal base 30.

The filter capacitor 50 at the final stage is integrated with the terminal base main body 31. The filter capacitor 50 is formed, for example, by a film capacitor rolled into a cylinder. The filter inductor 48 and the filter capacitor 50 form an LC filter circuit.

The filter capacitor 50 includes a main portion, which is a capacitor main body 51, a positive terminal plate 52, and a negative terminal plate 53. The capacitor main body 51 is formed as a square pole. The capacitor main body 51 is embedded in the terminal base main body 31, such that a part, or one end face, of the capacitor main body 51 is exposed via the outward protrusion 31c. The positive terminal plate 52 and the negative terminal plate 53 are provided on a part of the capacitor main body 51 that is exposed via the outward protrusion 31c.

A copper plate that serves as the positive terminal plate 52 extends from the terminal screw 32. Specifically, a ring portion at the distal end of the positive terminal plate 52 is fitted to the terminal screw 32. In this manner, the positive terminal of the filter capacitor 50 is electrically connected to the terminal screw 32.

Another copper plate that functions as the negative terminal plate 53 of the filter capacitor 50 extends from the fixing bolt 35. Specifically, a ring portion at the distal end of the negative terminal plate 53 is fitted to the fixing bolt 35. The fixing bolt 35 is electrically connected to the case 20. In this manner, the negative terminal of the filter capacitor 50 is electrically connected to the case 20 to be earthed.

As described above, the filter capacitor 50 is arranged outside of the case 20, and is connected to the output line L1 of the DC/DC converter 40.

Operation of the thus configured power supply unit 10 will now be described.

When the switching element 42 of the DC/DC converter 40 is activated, radiation noise is generated in the case 20.

Since it is blocked by the case 20 serving as a shielding member, the radiation noise is prevented from being radiate to the outside of the case 20.

Even if the radiation noise is transmitted to a line in the case 20, that is, the terminal plate 33, the noise on the terminal plate 33 is removed by the filter capacitor 50 arranged outside the case 20. Thus, the noise is prevented from being emitted to the outside of the case 20 via the output line L1 of the DC/DC converter 40. That is, noise generated inside the case 20 is prevented from being transmitted to the external device connected to the output line L1 via the output line L1.

As described above, the capacitor 50 is not located inside the case 20, but outside the case 20. Therefore, the external device, which is located outside of the case 20, is prevented from being influenced by radiation noise generated inside the case 20.

If a filter capacitor is provided in the case 20, the external device is influenced to some extent by radiation noise generated inside the case 20. That is, noise is transmitted to a part of the output line of the DC/DC converter that is between the filter capacitor and the case 20 in the case 20, and exits the case 20 via the output line. In contrast, according to the present embodiment, even if noise is transmitted to the output line L1 in the case 20 and exits the case 20 through the output line L1, the noise is removed by the filter capacitor 50 provided in the output terminal base 30.

The present embodiment as illustrated above has the following advantages.

(1) The filter capacitor 50 is located outside the case 20. This reduces the influence of noise radiated inside the case 20 to the outside of the case 20. For example, the present embodiment is different from a case in which a filter capacitor is provided inside the case 20, which serves as shielding member. That is, according to the present embodiment, radiation noise generated inside the case 20 is prevented from being transmitted to the external device connected to the output line L1 via the output line L1. Also, locating the filter capacitor 50 outside the case 20 does not complicate the inner structure or wiring in the case 20. Further, the filter capacitor 50 can be attached to the case 20 without significantly changing the size of the power-supply unit 10.

(2) The filter capacitor 50 is provided on the output terminal base 30 attached to the outer side of the case 20. This shortens the distance between the terminal screw 32, which is the output terminal of the electronic device, and the filter capacitor 50. Since the filter capacitor 50 is provided on the output terminal base 30, the size of the electronic device is maximally prevented from being increased. The filter capacitor 50 is incorporated in the output terminal base 30, which is a component originally used with the electronic device, so that the filter capacitor 50 is attached to the outer side of the electronic device. Therefore, the filter capacitor 50 can be mounted to the electronic device without changing the wiring and size of the electronic device. That is, it is possible to reduce noise without increasing the size of the DC/DC converter 40.

The present invention is not restricted to the illustrated embodiments but may be embodied in the following forms.

Figure 5:
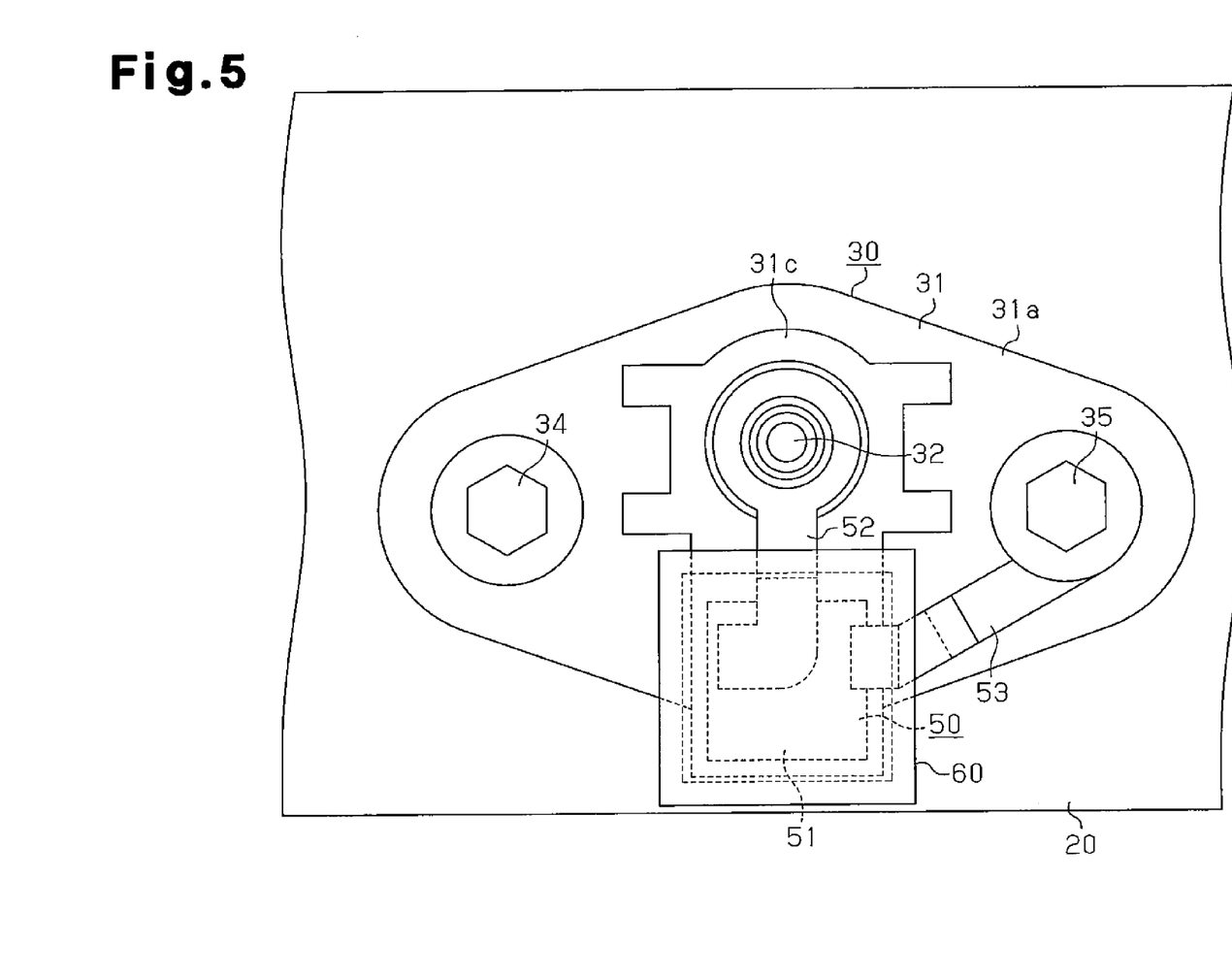
FIG. 5 is a front view showing a power-supply unit according to a modified embodiment.
Figure 6:
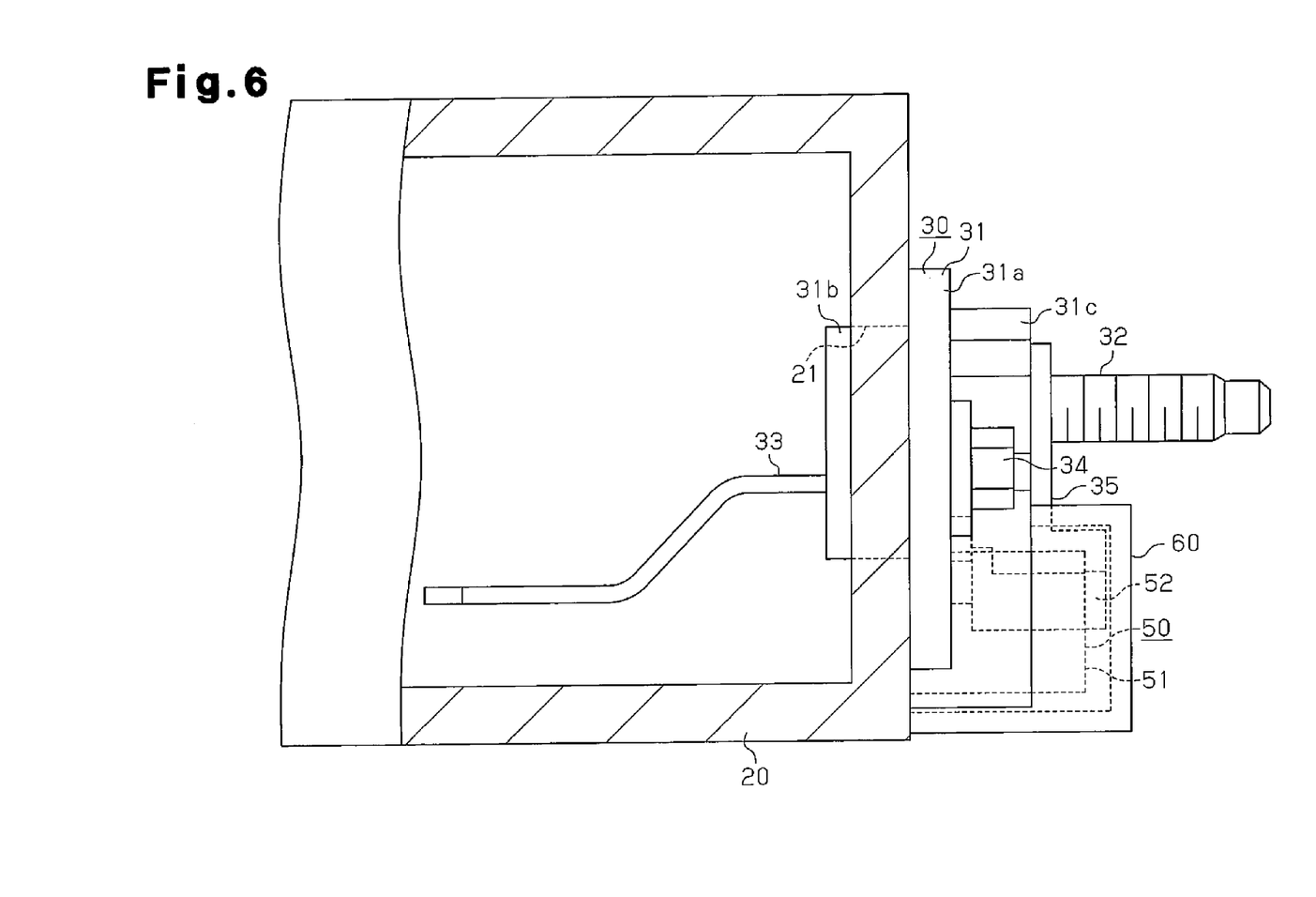
FIG. 6 is a side view, with a part cut away, illustrating the power-supply unit of FIG. 5.

As shown in FIGS. 5 and 6, the power-supply unit may further include a filter capacitor shielding member 60 for shielding the perimeter of the filter capacitor 50. The filter capacitor shielding member 60 is shaped like a box that encompasses the filter capacitor 50. The filter capacitor shielding member 60 has an opening in a side facing the case 20 to accommodate the filter capacitor 50. The filter capacitor shielding member 60 is attached to the output terminal base 30.

In this manner, the filter capacitor 50 attached to the outer side of the case 20 is shielded by the filter capacitor shielding member 60. Further reduction of noise is thus possible. That is, the filter capacitor 50, which is connected to the terminal screw 32 serving as a terminal of the electronic device, is shielded by the filter capacitor shielding member 60. This reduces the influence of external noise on the filter capacitor 50. Accordingly, noise is further reduced.

In the illustrated embodiments, the aluminum case 20 functions as a shielding member. However, other types of shielding member may be employed. For example, a resin case with an inner surface coated with a metal layer may be used as a shielding member.

In the illustrated embodiments, the filter capacitor 50 is provided on the output terminal base 30. However, a filter capacitor may be directly provided on a case.

In the illustrated embodiment, the disclosure is applied to a DC/DC converter, which is an electric circuit. However, the application is not limited to this, and the disclosure may be applied to a power converter apparatus or other types of apparatuses.

In the illustrated embodiments, the discloser is applied to a power-source unit, which is an electric device. However, the application is not limited to this, and the disclosure may be applied to other types of apparatuses.

What is claimed:

1. An electronic device, comprising:
   a shielding member;
   a terminal base main body attached to an outer side surface of the shielding member;
   an electric circuit that has an output line and is arranged inside the shielding member; and
   a filter capacitor that is embedded in the terminal base main body to be connected to the output line,
   wherein the shielding member comprises a case.

2. The electronic device according to claim 1, further comprising a filter capacitor shielding member that shields the perimeter of the filter capacitor.

3. A power-supply unit, comprising:
   a case, which serves as a shielding member;
   a DC/DC converter that has an output line and is arranged inside the case;
   a terminal base main body attached to an outer side surface of the case; and
   a filter capacitor that is embedded in the terminal base main body to be connected to the output line.

4. The electronic device according to claim 1 further comprising;
   a fastening member fastening the terminal main body to the shielding member; and
   an output terminal that is extended to the outside of the shielding member to be connected to the output line,
   wherein a positive terminal of the filter capacitor is electrically connected to the output terminal, and
   wherein a negative terminal of the filter capacitor is electrically connected to the fastening member.

5. The electronic device according to claim 4, wherein the negative terminal of the filter capacitor is electrically connected to the case to be earthed.

* * * * *